(12) United States Patent
Shute et al.

(10) Patent No.: US 9,042,482 B2
(45) Date of Patent: May 26, 2015

(54) FBR DC VECTOR OFFSET REMOVAL USING LO PHASE SWITCHING

(75) Inventors: Nick Shute, Cambridge (GB); Timo Gossmann, Neubiberg (DE); Andrei Panioukov, Moscow (RU); Dirk Friedrich, Neubiberg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 204 days.

(21) Appl. No.: 13/428,455

(22) Filed: Mar. 23, 2012

(65) Prior Publication Data

US 2013/0251069 A1   Sep. 26, 2013

(51) Int. Cl.
*H04K 1/02* (2006.01)
*H04L 27/36* (2006.01)
*H04B 1/04* (2006.01)

(52) U.S. Cl.
CPC ............ *H04L 27/361* (2013.01); *H04L 27/364* (2013.01); *H04B 1/0475* (2013.01)

(58) Field of Classification Search
CPC ............... H04B 2001/0425; H04B 2001/0433; H04B 1/0475; H03F 1/3247; H03F 1/3294; H03F 2200/336; H04L 27/364; H04L 27/361; H01Q 3/36
USPC .............. 375/295, 296; 455/91, 114.2, 114.3, 455/130, 205, 208, 209
See application file for complete search history.

(56) References Cited

U.S. PATENT DOCUMENTS

| | | | | |
|---|---|---|---|---|
| 4,675,886 A | * | 6/1987 | Surie | 375/368 |
| 6,320,915 B1 | * | 11/2001 | Stott et al. | 375/340 |
| 7,505,522 B1 | * | 3/2009 | Larsson | 375/260 |
| 8,487,799 B1 | * | 7/2013 | Matsuura | 341/144 |
| 2007/0021078 A1 | | 1/2007 | Boos | |
| 2009/0042521 A1 | * | 2/2009 | Otaka et al. | 455/126 |
| 2011/0140779 A1 | * | 6/2011 | Koren et al. | 330/149 |

FOREIGN PATENT DOCUMENTS

CN   101364968 A   2/2009

OTHER PUBLICATIONS

Chinese Office Action dated Sep. 16, 2014 in connection with Chinese Patent Application No. 201310093910.4.

* cited by examiner

*Primary Examiner* — Vineeta Panwalkar
(74) *Attorney, Agent, or Firm* — Eschweiler & Associates, LLC

(57) ABSTRACT

One embodiment relates to a feedback receiver (FBR). The FBR includes a FBR signal input configured to receive a radio frequency (RF) signal, a first local oscillator (LO) signal input configured to receive a first LO signal having an LO frequency, and a second LO signal input configured to receive a second LO signal having the LO frequency. The second LO signal is phase shifted by approximately 90° relative to the first LO signal. FBR also includes a divider that induces a time-varying phase shift in the first and second LO signals while concurrently retaining a 90° phase shift between the first and second LO signals.

17 Claims, 3 Drawing Sheets

FBR DC VECTOR OFFSET REMOVAL USING LO PHASE SWITCHING

BACKGROUND

One technique that can be used to exchange data during wireless communication is polar modulation. Delta-phase modulators are one type of modulator that are becoming more popular for implementing polar modulation. The present disclosure provides for improved feedback receivers (FBRs) that are well suited for use in these and other modulators and demodulators.

BRIEF DESCRIPTION OF THE DRAWINGS

In the text which follows, the invention will be explained in detail by means of a number of exemplary embodiments. The embodiments shown are in no way restricted and the individual features can be combined with one another arbitrarily.

DETAILED DESCRIPTION

Figure 1:
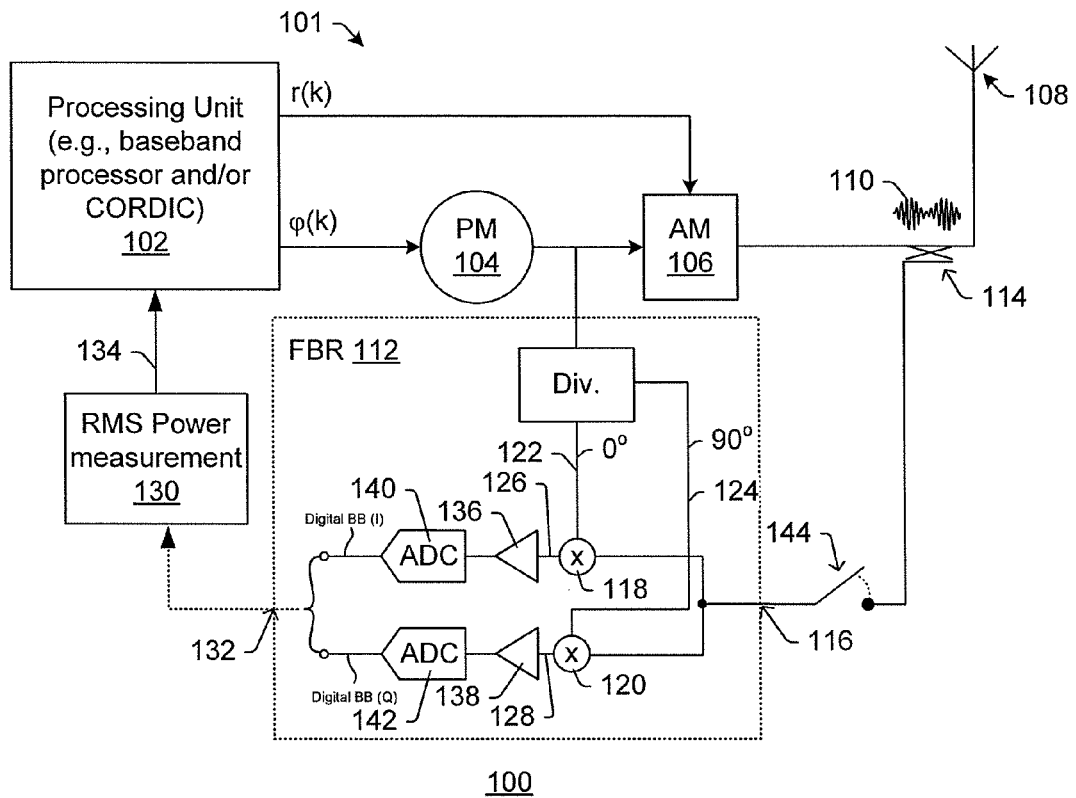
FIG. 1 illustrates a polar transmitter that includes a feedback receiver (FBR) that suffers from some shortcomings.

One or more implementations of the present invention will now be described with reference to the attached drawings, wherein like reference numerals are used to refer to like elements throughout. The drawings are not necessarily drawn to scale.

FIG. 1 shows transmitter 100 including a delta phase modulator that suffers from some shortcomings. The transmitter 100 includes a processing unit 102, a phase modulator 104, an amplitude modulator 106, and an antenna 108 operably coupled as shown. These components work in coordinated fashion to modulate a digital bit stream onto a carrier wave to produce an RF signal 110 that conveys the digital bit-stream to a receiver (not shown).

To help limit imperfections in transmission, a directional coupler 114 diverts some power of the RF signal 110 to a feedback receiver (FBR) 112, and in particular to an RF input 116 thereof. Mixers (118, 120) receive respective LO signals (122, 124, respectively), which are phase shifted by 90° relative to one another. By using these LO signals (122, 124), the mixers (118, 120, respectively) provide respective frequency-converted signals along an I-data path 126 and Q-data path 128, respectively. Ultimately, a root-mean square (RMS) power measurement module 130, which can be implemented in hardware or in software (e.g., running on processing unit 102), monitors the RMS power of FBR output signal 132. This monitored RMS power is commonly used to control the output power of the transmitter (e.g., RF signal 110) by providing a feedback signal 134 to the processing unit 102 or to other components in transmission path 101.

Although FBR 112 attempts to accurately measure RMS power in this way, the dynamic range of conventional FBRs (e.g., FBR 112) is limited by several factors. For example, the bottom end of the FBR dynamic range can be limited by uncompensated DC vector offsets in the FBR IQ data paths 126, 128 (e.g., theoretical minimum of about +/−0.5 LSB), low frequency flicker noise generated by power amplifiers 136, 138 (e.g., often less than about 0.5 LSB), and low-frequency errors due to the analog to digital converters 140, 142 (e.g., often less than about 0.5 LSB).

Figure 2:
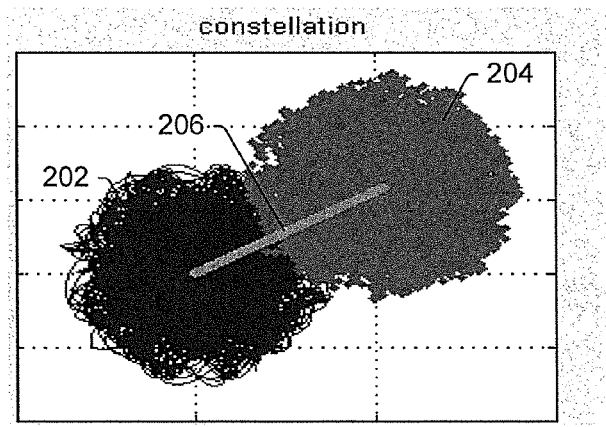
FIG. 2 is a constellation diagram relating to the FBR of FIG. 1.

To explain more clearly how uncompensated DC vector offsets can cause problems, FIG. 2 shows an example IQ constellation diagram 200 for FBR 112. The constellation diagram 200 includes an FBR input signal 202 (blue, e.g., on 116 in FIG. 1) and an FBR output signal 204 (red, e.g., on 132 in FIG. 1). Hence the change between the FBR input signal 202 and FBR output signal 204 represents an undesirable DC offset vector (green) 206 introduced within the FBR 112. The introduction of this DC offset vector 206 causes the RMS power measurements measured at the FBR output 132 to be shifted from the corresponding power of the actual RF signal 110. If unaccounted for, the DC offset vector 206 can cause the actual power spectrum being transmitted from the transmitter 100 to vary from a target power spectrum. This can cause the transmitted power to be too high at some times, which can unnecessarily shorten battery life, or can cause the transmitted power to be too low at other times, which can lead to excess data errors such as corrupted data or dropped calls, for example.

In an attempt to measure this undesirable DC offset vector 206 so that subsequent RMS power measurements can accurately account for it, FIG. 1's FBR 112 includes an isolation switch 144. The isolation switch 144 is opened to allow the transmitter 100 to measure the DC offset vector 206 at a first time. After the DC offset vector 206 is measured, the isolation switch 144 is closed to allow normal FBR operation and DC offset-compensated RMS measurements to subsequently occur. Unfortunately, however, the DC offset vector 206 can vary over time (e.g., based on temperature, supply voltage and/or other dynamic operating conditions), such that the DC offset vector measured at the first time is not necessarily accurate for subsequent RMS measurements. Therefore, the isolation switch 144 of FIG. 1 is not an optimum solution to account for the DC vector offset 206 introduced in the FBR 112.

To allow for real-time DC offset vector compensation without switching off an FBR receiver, the present disclosure has developed techniques where the phases of LO signals received by the FBR are modulated (e.g., switched or "chopped" in time). The phase-modulated LO signals are used to down-convert the RF signal in the FBR to produce down-converted IQ signals. These down-converted IQ signals then pass through a high pass filter to remove the DC offset vector (as well as other low frequency noise) in the FBR. These disclosed FBR techniques allow delta-phase modulators to transmit with a power spectrum that is well within target ranges in an efficient manner, thereby helping to strike a good balance between long battery lifetimes and reliable communication.

Figure 3:
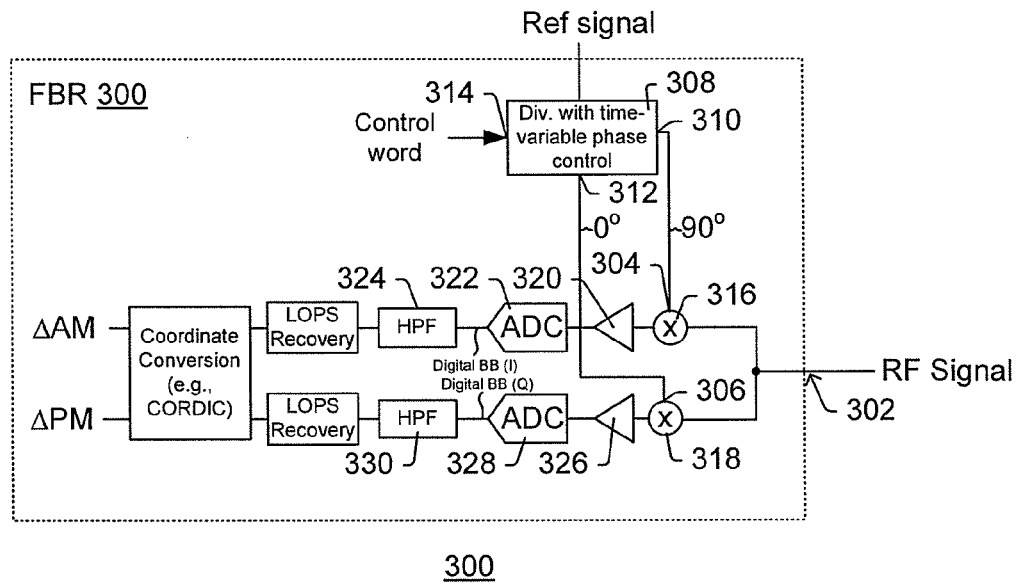
FIG. 3 is a exemplary embodiment an FBR.

FIG. 3 shows an FBR 300 in accordance with some embodiments. The FBR 300 includes a FBR signal input 302 configured to receive a radio frequency (RF) signal, as well as first and second local oscillator (LO) signal inputs 304, 306, respectively, configured to receive a first and second LO signals, respectively. The first and second LO signals both share the same LO frequency, but the second LO signal is phase shifted by approximately 90° relative to the first LO signal. In addition, the FBR 300 includes a divider 308 with time variant phase control. The divider 308 has a first LO output 310 coupled to the first LO signal input 304, a second LO output 312 coupled to the second LO signal input 306, and a phase control terminal 314. As will be appreciated in more detail further herein, a digital phase control word is provided to the phase control terminal 314 to induce a time-varying phase shift in the first and second LO signals while concurrently retaining a 90° phase shift between the first and second LO signals. The time-varying phase shift often follows a predetermined pattern where phase changes occur at regular intervals, but the time-varying phase shift can also be pseudo-random or random.

A first frequency conversion device 316, often implemented as a mixer, has an RF input coupled to the FBR signal input 302 and has a first LO input coupled to the first LO signal input 304. A second frequency conversion device 318, which is also often implemented as a mixer, has an RF input coupled to the FBR signal input 302 and having a second LO input coupled to the second LO signal input 306.

A first amplifier 320, first analog to digital converter (ADC) 322, and first high pass filter 324 are downstream of the first frequency conversion device 316. A second amplifier 326, second ADC 328, and second high pass filter 330 are downstream of the second frequency conversion device 318. The first and second high pass filters 324, 330 attenuate the DC vector offset as well as low-frequency noise to allow accurate RMS power monitoring.

Figure 4:
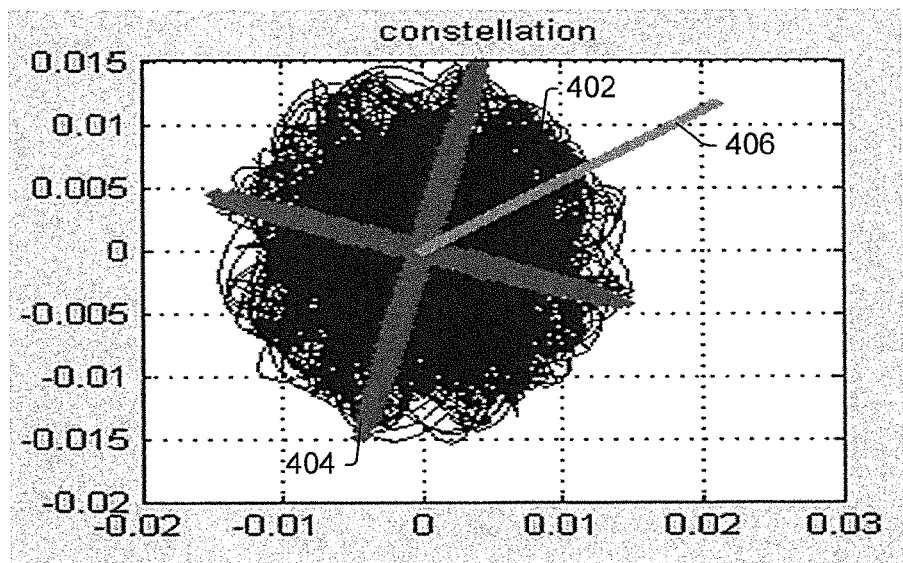
FIG. 4 is an example constellation diagram consistent with one implementation consistent with the FBR of FIG. 3

To better illustrate functionality of FBR 300, FIG. 4 shows an example constellation diagram 400 consistent with an implementation of FIG. 3's FBR 300. The constellation diagram 400 includes an FBR input signal 402 (blue, e.g., on 302 in FIG. 3) and an FBR output signal 404 (red, e.g., output from HPFs 324, 330 in FIG. 3). Although the FBR 300 internally exhibits a DC vector offset 406, the time-variant phase shifting of the LO signals causes the FBR output signal 404 to have a different shape—in this example an "X" rotated at some angle due to the LO "chopping." The high pass filters 324, 330 attenuate the DC vector offset 406, such that the FBR output signal 404 is no longer offset from the FBR input signal 402 by DC vector offset 406, but rather the FBR output signal 404 is centered at the origin with the FBR input signal 402. Because the DC vector offset 406 is attenuated at the FBR output 404, subsequent RMS power measurements for FBR 300 in FIG. 3 can be more accurate than with conventional FBR techniques.

Tables 1a-1b below show some examples of how the divider with time variable phase control 308 in FIG. 3 can time-variantly phase shift the LO signals on 312, 314 to obtain dual polarity I- and Q- signals to 320, 326. In Table 1a, the phases of the LO signals on 310, 312 each are shifted by 180° at each pulse of a chopping clock having a fixed frequency (e.g., time 0, time 1, time 2, time 3). For example, the first LO signal provided to the first frequency conversion device 316 varies between a phase shift of 0° and 180° in time, while the second LO signal provided to the second frequency conversion device 318 varies between 90° and 270° in time. However, the first and second LO signals still remain offset by a substantially constant phase shift of 90°, relative to each other. Although the chopping clock can have a fixed frequency in many embodiments, in other embodiments, a variable, pseudo-random or random frequency could also be used.

TABLE 1a

|  | Phase of LO signal to I-path | Phase of LO signal to Q-path |
|---|---|---|
| Time 0 | 0° | 90° |
| Time 1 | 180° | 270° |
| Time 2 | 0° | 90° |
| Time 3 | 180° | 270° |

Table 1b shows another example of how the LO signals to the first and second frequency conversion devices 316, 318 can be changed in time.

TABLE 1b

|  | Phase of LO signal on I-path | Phase of LO signal on I-path |
|---|---|---|
| Time 0 | 0° | 90° |
| Time 1 | 180° | 90° |
| Time 2 | 180° | 270° |
| Time 3 | 0° | 270° |
| Time 4 | 0° | 90° |

Thus, in the examples of Table 1a-1b above, the first and second LO signals on 310, 312 retain a substantially constant 90° phase shift relative to one another, but each individual LO signal has a time-variant phase shift. The time-variant phase shift is based on the phase control word provided on phase control terminal 314.

In FIG. 3's embodiment, the divider with time variable phase control 308 can be implemented in several different ways. In some embodiments, the control word provided to the time-variant phase-shifter can induce a phase shift in the signals provided to the local oscillator inputs of the frequency conversion elements 316, 318 such that the signals provided to the local oscillator inputs 304, 306 are balanced substantially about zero over a period of time that includes multiple time-varying phase shifts of the first and second LO signals. In other embodiments, the control word induces a regularly repeating phase-shift of approximately 180° in the first and second LO signals.

In some embodiments, a frequency doubler which is connected to the local-oscillator input may be used for the divider 308. In turn, this is followed by a frequency divider, for example in the form of a master-slave flip-flop. This would make it possible to generate in a simple manner two signals which have the local-oscillator frequency and a phase offset of 90° with respect to one another.

Figure 5:
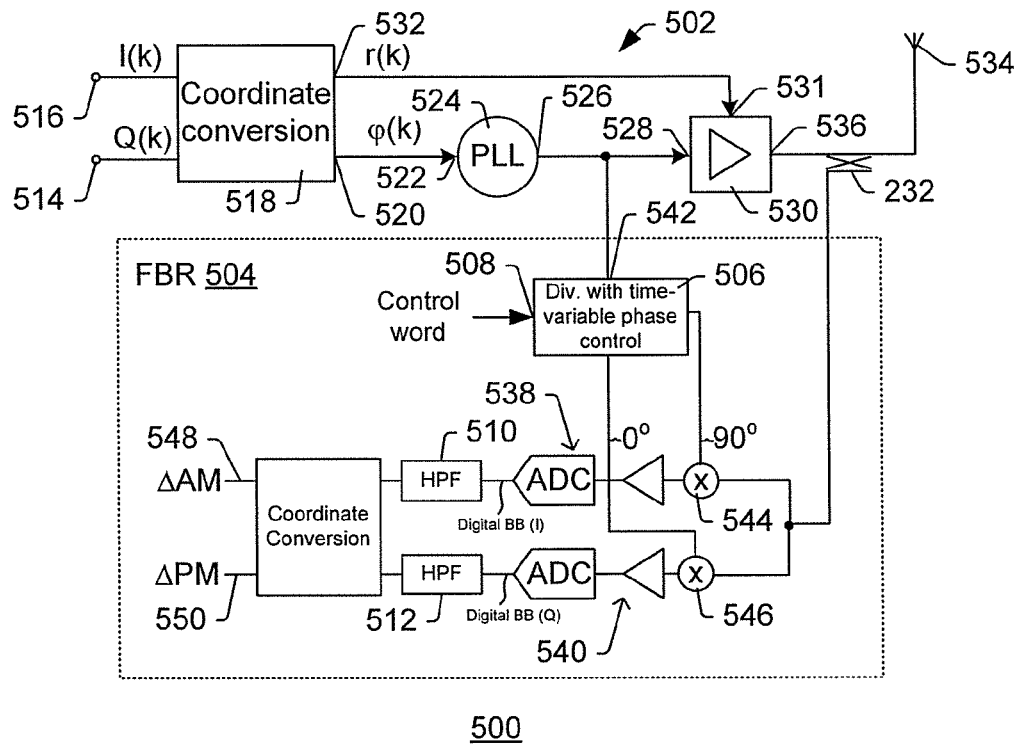
FIG. 5 illustrates an exemplary communication arrangement including a feedback receiver.

FIG. 5 shows a block diagram for an exemplary transmitting arrangement 500 that includes polar transmitter 502 and FBR 504. Consistent with FIG. 3's embodiment, FBR 504 includes an RF divider 506 with a phase control terminal 508 and high pass filters 510, 512 on the I and Q data paths.

The transmitting arrangement 500 is implemented in one example as an integrated circuit in a semiconductor body. It has a first input 514 and a second input 516 configured to receive a digital in-phase component I(k) and a digital quadrature component Q(k), respectively, of a signal to be transmitted. These are provided by a base band unit (not shown). In this arrangement, the base band unit takes into consideration the type of modulation to be used for the selected mobile communication standard. The binary data to be transmitted are combined to form so-called symbols to which individual I and Q values are allocated. These are supplied to the transmitting arrangement 500 as an in-phase component I(k) and quadrature component Q(k), according to the symbol clock k.

The inputs 514 and 516, respectively, are connected to a coordinate conversion device 518, such as a CORDIC. This generates a digital phase modulation word φ(k) and an associated digital amplitude modulation word r(k) from the in-phase component I(k) and the quadrature component Q(k). The phase modulation word φ(k) specifies the angle between the x axis on the IQ plane and the symbol to be transmitted, while the amplitude modulation word r(k) specifies the radial magnitude of the symbol to be transmitted relative to the origin of the IQ plane.

The output 520 of the converting device 518 for delivering the phase modulation word φ(k) is connected to a correcting input 522 of a phase-locked loop 524. From this, the phase-locked loop 524 generates a frequency- and phase-modulated carrier signal and delivers it at its output 526. The output 526 is connected to a signal input 528 of a power amplifier 530. The phase-locked loop 524 and the power amplifier 530 are part of the polar transmitter 502.

The power amplifier 530 also comprises a control input 531. This is connected to the second output 532 on which the amplitude modulation word r(k) is provided. The two outputs 520 and 532 of the converting device 518 at the same time also form the first and second signal inputs for the polar transmitter 502.

Due to the amplitude modulation word r(k) supplied at the correcting input 530, the power amplifier 530 changes its supply voltage. The resultant modulation of the supply voltage also changes the gain as a result of which the carrier signal supplied at the input end, which is already phase modulated, is modulated in its amplitude. Thus, the supply voltage of the power amplifier 530 is modulated by the amplitude modulation word r(k), and thus an amplitude modulation is applied to the carrier signal. The amplified and amplitude-modulated signal is delivered to the antenna 534 at the output 536 of the power amplifier 530.

A directional coupler 552 feeds back some of the power in the RF signal provided to the antenna 534 back to the feedback receiver 504. The FBR 504 is constructed in this embodiment as an I/Q demodulator having an i-data path 538 and q-data path 540. It includes a divider 506 having a reference signal input 542 to receive the frequency- or phase-modulated signal delivered by the phase-locked loop 524. LO outputs of the divider 506 are coupled to LO inputs of first and second mixers 544, 546. A digital control word received on divider control terminal 508 modulates the respective phases of the LO signals provided to the mixers 544, 546. The mixer outputs are connected to connections 548 and 550, respectively, after passing through amplifiers, analog to digital converters (ADCs), and high pass filters 510, 512.

Although FIG. 5 illustrates a FBR in the context of a transmitting arrangement, it will also be appreciated that FBRs in accordance with the present disclosure are not limited to transmitters. Rather, these FBR techniques can also be used in other communication devices as well, such as in receivers for example.

Figure 6:
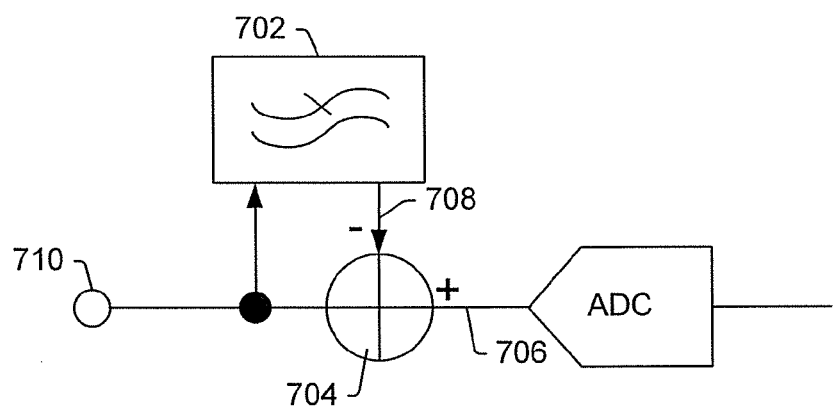
FIG. 6 is a block diagram illustrating an exemplary high pass filter.

FIG. 6 shows an embodiment of a high pass filter 700 (e.g., high pass filter 324, 330 of FIG. 3), which uses a low-pass filter 702 and a subtraction element 704 for static offset compensation. The subtraction element 704 has a first input 706 coupled to an output of the ADC, and has a second input 708 coupled to the output of the low-pass filter 702. During operation, high frequency and low frequency components pass from the ADC into the subtraction element 704, but only the low frequency components are fed back to the second input via the low pass filter 702. Thus, these low-frequency components in the input ADC signal are subtracted when output to the high pass filter output 710. Thus, the high pass filter output 710 acts as a high-pass filter tracking system and all low frequency disturbances (e.g., DC offset, flicker noise, IQ phase imbalance, leakage of LO to mixer input) will be cancelled by the high pass filter tracking system.

Although the disclosure has been shown and described with respect to one or more implementations, equivalent alterations and modifications will occur to others skilled in the art based upon a reading and understanding of this specification and the annexed drawings. Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:
1. A feedback receiver (FBR), comprising:
a FBR signal input configured to receive a radio frequency (RF) signal;
a first local oscillator (LO) signal input configured to receive a first LO signal having an LO frequency;
a second LO signal input configured to receive a second LO signal having the LO frequency, wherein the second LO signal is phase shifted by approximately 90° relative to the first LO signal; and
a divider comprising: a first LO output coupled to the first LO signal input, a second LO output coupled to the second LO signal input, and a phase control terminal;
wherein a phase control word is provided to the phase control terminal to induce a time-varying phase shift in the first and second LO signals while concurrently retaining a 90° phase shift between the first and second LO signals;
wherein the phase control terminal is configured to induce the time-varying phase shift to occur in the first LO signal or the second LO signal by shifting the first LO signal or the second LO signal by substantially 180° while concurrently retaining the 90° phase shift between the first LO signal and the second LO signal.
2. The FBR of claim 1, further comprising:
a directional coupler to provide the RF signal to the FBR signal input, wherein the directional coupler is continuously coupled to the FBR signal input.
3. The FBR of claim 1, further comprising:
a first frequency conversion device having an RF input coupled to the FBR signal input and having a first LO input coupled to the first LO signal input; and
a second frequency conversion device having an RF input coupled to the FBR signal input and having a second LO input coupled to the second LO signal input.

4. The FBR of claim 3, further comprising:
  a first high pass filter downstream of the first frequency conversion device; and
  a second high pass filter downstream of the second frequency conversion device.

5. The FBR of claim 4, wherein the first high pass filter comprises a low-pass filter and a subtraction element.

6. The FBR of claim 1, wherein the divider comprises: a frequency doubler which is connected to the LO input, and a frequency divider coupled to the frequency doubler.

7. A communication arrangement, comprising:
  a first signal input configured to receive a frequency modulation signal;
  a second signal input configured to receive an amplitude modulation signal;
  a phase-locked loop comprising an output and a correcting input which is coupled to the first signal input;
  an amplifying device comprising a control connection coupled to the second signal input, a signal input connected to the output of the phase-locked loop, and an amplifier output to provide an RF signal;
  a divider with time variant phase control, comprising:
    a reference signal input coupled to the output of the phase-locked loop,
    a control terminal to receive a control word, and
    first and second local oscillator (LO) outputs to provide respective first and second LO signals that are modulated based on the control word; and
  a feedback receiver (FBR) in the feedback path comprising an i-data path and a q-data path, wherein the i-data path is adapted to provide an i-data component based on the RF signal and the first LO signal and wherein the q-data path is adapted to provide a q-data component based on the RF signal and the second LO signal,
  wherein the control word induces a time-varying phase shift in the first and second LO signals to occur by shifting the first LO signal or the second LO signal by substantially 180° while concurrently retaining a 90° phase shift between the first LO signal and the second LO signal.

8. The communication arrangement of claim 7, wherein the control word causes the i-data and q-data components to be balanced substantially about zero.

9. The communication arrangement of claim 7, wherein the control word induces a regularly repeating phase-shift of approximately 180° in the i-data and q-data components in time.

10. The communication arrangement of claim 7, further comprising:
  a directional coupler configured to couple out a portion of the RF signal delivered by the amplifying device and deliver the portion of the RF signal to i-data path and q-data path of the FBR.

11. The communication arrangement of claim 10, wherein the directional coupler is continuously coupled to i-data path and q-data path of the FBR.

12. The communication arrangement of claim 10, further comprising:
  a first frequency conversion device having an RF input coupled to the directional coupler and having a first LO input to receive the first LO signal; and
  a second frequency conversion device having an RF input coupled to the directional coupler and having a second LO input to receive the second LO signal.

13. The communication arrangement of claim 12, further comprising:
  a first high pass filter downstream of the first frequency conversion device; and
  a second high pass filter downstream of the second frequency conversion device.

14. The communication arrangement of claim 13, wherein the first high pass filter comprises a low-pass filter and a subtraction element.

15. The communication arrangement of claim 7, wherein, in response to the control word, the control terminal is configured to induce the time-varying phase shift to occur in the first LO signal or the second LO signal at a regular interval as a function of a predetermined pattern.

16. The communication arrangement of claim 15, wherein the predetermined pattern comprises the time-varying phase shift to alternate between the first LO signal and the second LO signal at various times while concurrently retaining the 90° phase shift between the first LO signal and the second LO signal.

17. The communication arrangement of claim 15, wherein the predetermined pattern comprises the time-varying phase shift to occur at both the first LO signal and the second LO signal at various times while concurrently retaining the 90° phase shift between the first LO signal and the second LO signal.

\* \* \* \* \*